United States Patent
Wigginton

[11] Patent Number: 5,225,633
[45] Date of Patent: Jul. 6, 1993

[54] BRIDGE CHIP INTERCONNECT SYSTEM

[75] Inventor: Stewart C. Wigginton, Belleville, Ill.

[73] Assignee: The United States of America as represented by the Secretary of the Air Force, Washington, D.C.

[21] Appl. No.: 776,651

[22] Filed: Oct. 4, 1991

[51] Int. Cl.⁵ .................. H02G 15/08; H01L 23/48
[52] U.S. Cl. ...................... 174/84 R; 29/827; 29/850; 174/88 R; 174/257; 174/261; 361/408; 257/666; 257/735
[58] Field of Search .............. 174/84 R, 88 R, 257, 174/258, 261; 29/827, 850; 361/408; 156/65; 357/69, 70

[56] References Cited

U.S. PATENT DOCUMENTS

| | | | |
|---|---|---|---|
| 2,977,672 | 4/1961 | Telfer | 29/850 |
| 3,579,206 | 5/1971 | Grange | 439/77 |
| 3,753,048 | 8/1973 | Tuck et al. | 361/408 |
| 4,378,902 | 4/1983 | Fedak | 228/6 A |
| 4,531,285 | 7/1985 | Lucas | 29/827 |
| 4,538,210 | 8/1985 | Schaller | 361/401 |
| 4,731,503 | 3/1988 | Kitanishi | 174/88 R |
| 4,783,719 | 11/1988 | Jamison et al. | 361/408 |
| 4,843,191 | 6/1989 | Thomas | 174/88 R |
| 4,989,067 | 1/1991 | Noble et al. | 357/69 |
| 4,999,460 | 3/1991 | Sugiyama et al. | 174/84 R |
| 5,060,052 | 10/1991 | Casto et al. | 357/69 X |

Primary Examiner—Morris H. Nimmo
Attorney, Agent, or Firm—William G. Auton; Donald J. Singer

[57] ABSTRACT

A bridge chip interconnect system is used for electrically interconnecting first and second semiconductor chip devices. The first and second semiconductor chip devices each are mounted adjacent to each other with a space therebetween and respectively have first and second row of ohmic contact pads on their top surfaces. The bridge chip interconnect system includes a rigid bridge base which has a top surface and which is placed in the space between the first and second semiconductor chip devices; and a plurality of conducting beams which are fixed to the top surface of the rigid bridge base and which have dimensions to enable each of them to make contact with one of the ohmic contact pads form each of the first and second row of ohmic contact pads.

11 Claims, 1 Drawing Sheet

BRIDGE CHIP INTERCONNECT SYSTEM

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to semiconductors, and more specifically the invention pertains to a bridge-chip connector for interconnecting two semiconductor devices that contain densely packed control points.

The trend in integrated circuit manufacture is toward greater integration of functions on a single chip. This results in more gates on the chips and higher input/output (I/O) pin counts. I/O requirements of over 200 leads on a single chip indicate a general trend involving the addition of increasingly numerous leads, which makes semiconductor chip interconnection more difficult. Electronic circuit systems are typically made by defining complex integrated circuit structures on semiconductor chips, bonding the chips to circuit package substrates, and in turn bonding the packages to printed circuit boards. The most common bonding technique is wire bonding, in which an instrument (a thermode) bonds wire to a bonding pad of one element, such as a chip, and then pulls the wire and makes a bond on a bonding pad of a second element so as to form a self-supporting wire bridge between the two bonding pads.

The task of interconnecting semiconductor chips to each other is alleviated, to some extent, by the systems disclosed in the following U.S. Patents, the disclosures of which are incorporated herein by reference:

U.S. Pat. No. 4,843,191 issued to Thomas;
U.S. Pat. No. 4,531,285 issued to Lucas; and
U.S. Pat. No. 4,378,902 issued to Fedak.

The patent to Lucas discloses bonding the lead frame material to a thin insulating film and forming the leads, then the film is removed where connections are to be made. The lead material is then plated and formed to provide stress relief in the package to board connection. The lead frame is then attached to the package and board. The patent to Thomas discloses usage of dielectric tape to cover a row of bonding pad connectors so that an additional row of bonding pad connectors can be used. The dielectric tape is electrically insulating. The patent to Fedak discloses a wall or spacer to prevent wire connections from shorting out.

The above-cited Thomas reference shows a system of parallel conductors fixed on dielectric tape. The present invention makes use of a rigid bridge base that can be wedged between fixed semiconductor chips to hold the conductive leads in a rigid fixed position over adjacent contact pads. The advantage of a rigid base is that it avoids one potential problem of dielectric tape. More specifically, dielectric tape is flexible, and movement of the tape (by jarring the device etc.) can displace the electrical connectors so that they disconnect from the correct contact pads, and perhaps short out. The thin insulating film used in the above-cited Lucas reference also appears to have a potential problem with displacement due to flexibility. The Lucas solution to the displacement problem is to add a strip of brace material to one end of the parallel leads. While this may solve the problem, a more elegant solution is provided by the present invention in using a rigid central insulating bridge brace with a plurality of parallel conductive beam leads fixed to its top surface.

While the above-cited references are helpful, the need remains to provide a method of interconnecting semiconductor chips which have densely parked control points. The present invention is intended to satisfy that need.

SUMMARY OF THE INVENTION

The present invention is a bridge chip interconnect system which is used for electrically interconnecting first and second semiconductor chip devices. The first and second semiconductor chip devices each are mounted adjacent to each other with a space therebetween and respectively have first and second row of ohmic contact pads on their top surfaces. The bridge chip interconnect system includes a rigid bridge base which has a top surface and which is placed in the space between the first and second semiconductor chip devices; and a plurality of conducting beams which are fixed to the top surface of the rigid bridge base and which have dimensions to enable each of them to make contact with one of the ohmic contact pads form each of the first and second row of ohmic contact pads.

One particular embodiment of the invention includes a bridge-chip connector for interconnecting two semiconductor devices that contain densely packed control points. A bridge chip with cantilevered gold beam leads can be fabricated on relatively inexpensive silicon. Many bridge chip devices can be processed and formed on one silicon wafer. A typical lead bridge chip is 11 um long $\times$ 3 um wide $\times$ 100 um thick and has 400 gold beams that are 12 um thick $\times$ 12 um wide on a 25 um pitch which are electrically isolated from one another. The bridge chip structurally supports semiconductor connectors.

It is an object of the present invention to electrically interconnect semiconductor devices that contain densely packed control points.

It is another object of the present invention to provide a bridge chip interconnect system that can be fabricated on inexpensive silicon.

It is another object of the present invention to replace the wire bonding method of interconnecting semiconductor devices.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes a bridge chip interconnect system that uses a bridge clip that is structurally supported for interconnecting semiconductors and allows connecting of densely packed control points. The reader's attention is now directed towards FIG. 1 which shows a typical beam lead bridge chip. This particular bridge chip characteristics are as follows: It is 11Kum long×3Kum wide×100um thick. It has 400 gold beams that are 12um thick×12um wide on a 25um pitch and electrically isolated from one another. The cantilevered beams extend over both edges of the chip from 250um to 350um in length.

Figure 1:
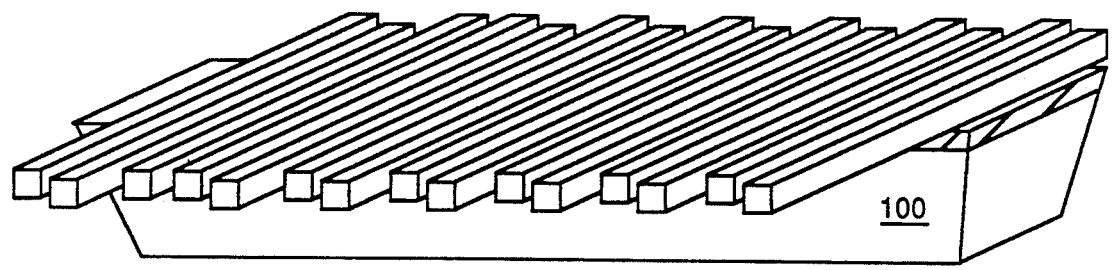
FIG. 1 is an illustration of the bridge chip interconnect system of the present invention.

Note that the dimensions of the bridge chip of FIG. 1 are intended only as an example of dimensions used with similarly-sized semiconductors chips. These dimensions can be changed for different applications.

The bridge chip of FIG. 1 has a plurality of gold beam leads fixed on a silicon base 100. Gold is a commonly used ohmic contact material, and it is believed that other metals (such as silver, copper, germanium, iron, aluminum, nickel and steel) would serve as suitable beam leads. The beam leads protrude out at different lengths in order to cover and connect with the ohmic contact points of semiconductor devices which are adjacent to the bridge chip interconnect system. In order to understand this application, the reader's attention is directed towards FIG. 2.

Figure 2:
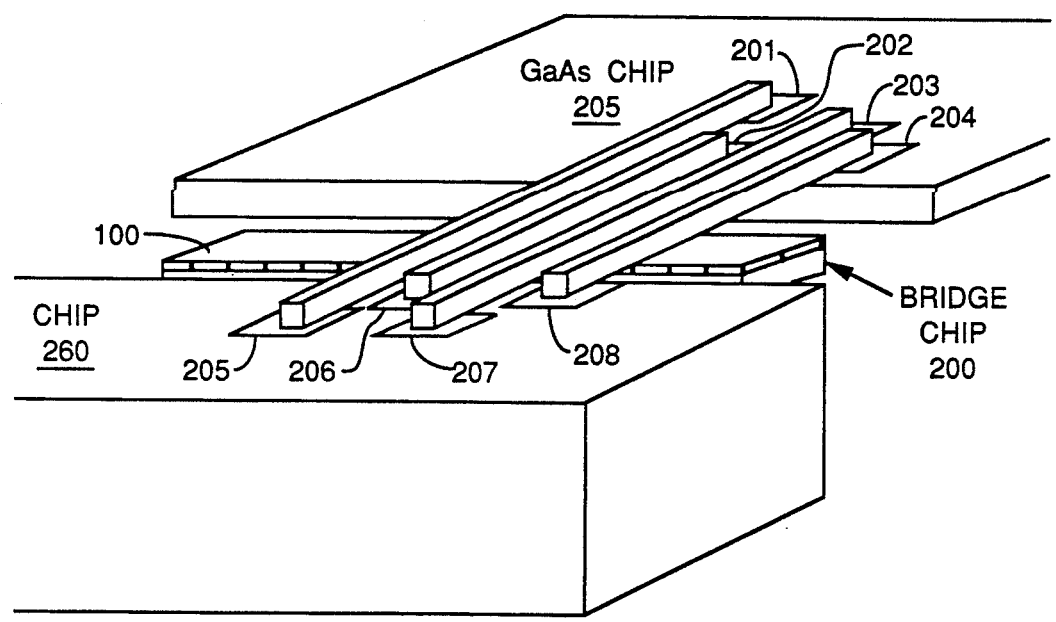
FIG. 2 is an illustration of the system of FIG. 1 being used to electrically interconnect the ohmic contact pads of two adjacent semiconductor chip devices.

FIG. 2 is an illustration which depicts the bridge chip 200 electrically interconnecting the ohmic contact points 201-208 of two adjacent chips 250 and 260. In FIG. 2, the gold beam leads make contact with the ohmic contact points when the bridge chip 200 is inserted between the two adjacent chips.

Once the bridge chip is inserted, the gold beam leads can be bump bonded to the contact points of adjacent chips, or else they can simply rely on their physical contact to electrically connect adjacent chips. Bump bonding and other methods of attaching ohmic contacts to each other is well-known in the art. These techniques are explained in such standard texts as "Metal Semiconductor Contacts" by E. H. Rhoderick, published by Clarendon Press in 1980, the disclosure of which is incorporated herein by reference.

Just as the beam leads can be fabricated from any material that is electrically conductive, the silicon base of the bridge chip can be fabricated from any material that is an insulating material. Undoped silicon is used as an example of a contact bridge base, but other insulators (ceramics, wood, etc.). As mentioned above, the above-cited Thomas reference shows a system of parallel conductors fixed on dielectric tape. The present invention makes use of a rigid bridge base that can be wedged between fixed semiconductor chips to hold the conductive leads in a rigid fixed position over adjacent contact pads. The advantage of a rigid base is that it avoids one potential problem of dielectric tape. More specifically, dielectric tape is flexible, and movement of the tape (by jarring the device etc.) can displace the electrical connectors so that they disconnect from the correct contact pads, and perhaps short out pads that they are not intended to make contact with.

The leads of the present invention may have different lengths, and need not necessarily be in parallel with each other. They must have dimensions that enable them to contact the adjacent rows of ohmic contacts, and must be spaced apart from each other so that each lead does not make contact with an adjacent lead.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A bridge chip interconnect system comprising:
    first and second semiconductor chip devices, said first and second semiconductor chip devices each being mounted adjacent to each other with a space therebetween and respectively having a first and second row of ohmic contact pads on their top surfaces;
    a rigid bridge base which has a top surface and which is placed in the space between the first and second semiconductor chip devices; and
    a plurality of conducting beams ar fixed to the top surface of the rigid bridge base and which have dimensions to enable each of them to make contact with one of the ohmic contact pads from each of the first and second row of ohmic contact pads on the first and second semiconductor chip devices between which the rigid base is to be fixed, said plurality of conducting beams collectively providing electrical connections between the first and second semiconductor chip devices, wherein said plurality of conducting beams comprise a plurality of conductive leads which are fixed atop said rigid bridge base so that they are spaced apart from each other and which have nonuniform lengths that enable them to contact pairs of ohmic contact points which have similar nonuniform distances.

2. A bridge chip interconnect system, as defined in claim 1, wherein said conductive beams are each parallel with each other.

3. A bridge chip system, as defined in claim 1, wherein said rigid bridge base comprises a block of insulator material which may be fabricated from materials selected from the group consisting of: silicon, ceramics, and wood.

4. A bridge chip system, as defined in claim 2, wherein said rigid bridge base comprises a block of insulator material which may be fabricated from materials selected from the group consisting of: silicon, ceramics, and wood.

5. A bridge chip system, as defined in claim 1, wherein said plurality of conductive beams are composed of electrically conductive materials selected from the group consisting of: gold, silver, copper, iron, germanium, aluminum and nickel.

6. A bridge chip system, as defined in claim 2, wherein said plurality of conductive beams are composed of electrically conductive materials selected from the group consisting of: gold, silver, copper, iron, germanium aluminum and nickel.

7. A bridge chip system, as defined in claim 4, wherein said plurality of conductive beams are composed of electrically conductive materials selected from the group consisting of: gold, silver, copper, iron, germanium, aluminum and nickel.

8. A process for electrically interconnecting first and second semiconductor chip devices, said first and second semiconductor chip devices, each being mounted adjacent to each other with a space therebetween and respectively having first and second row of ohmic contact pads on their top surfaces, wherein said process comprises the steps of:
    providing first and second semiconductor chip devices each being mounted adjacent to each other with a space therebetween and having first and second row of ohmic contact pads on their surfaces;
    fixing a rigid bridge interconnection system between said first and second semiconductor chip devices such that said rigid bridge interconnection system has a plurality of conducting beams which have nonuniform lengths and dimensions to enable each of them to make contact with one of the ohmic contact pads from each of the first and second row of ohmic contact pads, said plurality of conducting beams thereby collectively providing electrical connections between the first and second semiconductor chip devices; and bonding each of the conducting beams of the rigid bridge ohmic contact pads of the first and second row of ohmic contact points.

9. A process, as defined in claim 8, wherein said bonding step comprises creating a permanent electrical contact between the respective ohmic contact pads and the conducting beams using techniques that include bump bonding and soldering.

10. A process, as defined in claim 8, wherein said fixing step is performed using a rigid base which has a top surface and which is placed in the space between the first and second semiconductor chip devices, said rigid bridge base having said plurality of conducting beams mounted on its top surface.

11. A process, as defined in claim 9, wherein said fixing step is performed using a rigid base which has a top surface and which is placed in the space between the first and second semiconductor chip devices, said rigid bridge base having said plurality of conducting beams mounted on its top surface.

* * * * *